United States Patent [19]
Rhee

[11] Patent Number: 5,804,863
[45] Date of Patent: Sep. 8, 1998

[54] FIELD EFFECT TRANSISTORS INCLUDING SIDE BRANCH GROOVES AND FABRICATION METHODS THEREFOR

[75] Inventor: Tae-Pok Rhee, Seoul, Rep. of Korea

[73] Assignee: Samsung Electronics Co., Ltd., Suwon, Rep. of Korea

[21] Appl. No.: 852,141

[22] Filed: May 6, 1997

[30] Foreign Application Priority Data

Aug. 8, 1996 [KR] Rep. of Korea ................. 1996-33081

[51] Int. Cl.$^6$ ............ H01L 29/76; H01L 29/94; H01L 31/062; H01L 31/113
[52] U.S. Cl. .......... 257/401; 257/328; 257/330; 257/331
[58] Field of Search .................. 257/401, 328, 257/330, 331

[56] References Cited

U.S. PATENT DOCUMENTS 4,072,975  2/1978  Ishitani .
4,393,391  7/1983  Blanchard .................. 357/23
5,095,343  3/1992  Klodzinski et al. .
5,192,989  3/1993  Matsushita et al. .
5,418,394  5/1995  Hertrich .
5,442,216  8/1995  Gough .
5,444,275  8/1995  Kugishima et al. .
5,453,637  9/1995  Fong-Chun et al. .
5,698,880  12/1997  Takahashi et al. .

Primary Examiner—Stephen Meier
Attorney, Agent, or Firm—Myers Bigel Sibley & Sajovec

[57] ABSTRACT

A field effect transistor includes radially extending grooves in a microelectronic substrate. At least one of the radially extending grooves includes a side branch groove extending from it. A ring-shaped gate is included on the radially extending grooves. The ring-shaped gate defines inner and outer regions of the microelectronic substrate. Source and drain regions are included in the respective inner and outer regions of the microelectronic substrate. The side branch grooves may be used to decrease on-state resistance and increase drive current of the field effect transistor.

15 Claims, 5 Drawing Sheets

FIELD EFFECT TRANSISTORS INCLUDING SIDE BRANCH GROOVES AND FABRICATION METHODS THEREFOR

FIELD OF THE INVENTION

This invention relates to microelectronic devices, and more particularly to microelectronic field effect transistors and fabrication methods therefor.

BACKGROUND OF THE INVENTION

Field effect transistors are widely used in microelectronic devices including, but not limited to, microprocessors and memory devices. Field effect transistors are also widely used as power semiconductor devices, i.e. devices which are capable of handling high currents and voltages.

One example of a field effect transistor which is used as a power device is a driver integrated circuit (IC) which drives a liquid crystal display. It is generally desirable for a driver IC to have a high breakdown voltage, high operating voltage, high driver current and low on-state resistance. In order to satisfy these conditions, a driver IC is generally designed to have a high resistance diffused layer which is doped at a low density. However, as the density of the diffused layer is lowered, the breakdown voltage may increase and the current driving capability may be lowered. Also, the on-state resistance may increase. In order to overcome these problems, it is known to provide a driver integrated circuit having a large channel width and a large driver chip size.

In order to overcome these and other problems, it has also been proposed to use double diffused metal oxide semiconductor (DMOS) transistors, and/or MOS Field Effect Transistors (MOSFETs) having a lightly doped drain (LDD) or a double diffused drain (DDD). However, these structures may also have drawbacks. For example, the DMOS transistor may have a high operating voltage, but may occupy a large area in a microelectronic substrate. As another example, for field effect transistors having DDD or LDD structures, it may be difficult to obtain a sufficiently high operating voltage.

In order to reduce the on-state resistance of a field effect transistor, it is known to increase the current flow between the source and drain thereof, while increasing the channel width. See, for example, U.S. Pat. No. 4,393,391 entitled "Power MOS Transistor With a Plurality of Longitudinal Grooves to Increase Channel Conducting Area", which discloses a technique for increasing the channel width by forming grooves on a surface of a substrate and forming a gate thereon.

FIGS. 1 and 2 illustrate a field effect transistor according to U.S. Pat. No. 4,393,391. FIG. 1 is a perspective view of this transistor, and FIG. 2 is a cross-sectional view taken along the lines II–II' of FIG. 1.

As shown in FIGS. 1 and 2, ridges 4A and furrows 4B are formed in a semiconductor substrate 1 by forming grooves or trenches in a face of the substrate 1. A source 2 and a drain 3 are formed on respective ends of the ridges 4A and the furrows 4B. A gate oxide layer 5 and a gate electrode 7 are then formed on the surfaces of the ridges 4A and the furrows 4B. As illustrated in FIG. 1, the width W of the channel can be increased by the ridge and furrow portions, while the length of the channel may be maintained as is, so that the on-state resistance can be reduced.

Unfortunately, although this technique is directly applicable to field effect transistors having identical widths at the source end and the drain end of the channel, it may not be suitable for field effect transistors where the channel width at the source end and drain end of the channel are substantially different from one another. For example, if the source is formed inside a ring-shaped (also referred to as doughnut-shaped) gate electrode and the drain is formed outside the gate electrode, the decrease of the on-state resistance and the increase of the driver current may only be obtained in proportion to the increase of is the width of the source end of the channel. However, increases in the width in the source end of the channel may be limited by the field effect transistor design. This in turn may limit the increase in the width at the drain end of the channel.

SUMMARY OF THE INVENTION

It is therefore an object of the present invention to provide improved field effect transistors and methods of fabricating the same.

It is another object of the present invention to provide field effect transistors and fabrication methods which can reduce the on-state resistance.

These and other objects are provided according to the present invention by a field effect transistor which includes a plurality of radially extending grooves wherein at least one of the radially extending grooves includes a side branch groove which extends therefrom. By providing at least one side branch groove, the area where the channel width is relatively small can be widened, which can provide a decrease in the on-state resistance and an increase of the driver current of the field effect transistor. Side branch grooves may also be used in other field effect transistor designs, particularly when the source and drain regions are different widths.

In particular, field effect transistors according to the present invention include a microelectronic substrate and a plurality of radially extending grooves in the microelectronic substrate. At least one of the radially extending grooves includes a side branch groove extending therefrom. A ring-shaped gate is included on the radially extending grooves. The ring-shaped gate defines inner and outer regions of the microelectronic substrate. A first doped region is included in the inner region of the microelectronic substrate and a second doped region is included in the outer region of the microelectronic substrate.

In one embodiment of the present invention, the radially extending grooves are radially arranged in a circle. Alternating ones of the radially extending grooves include a side branch groove extending therefrom.

In another embodiment of the present invention, the radially extending grooves are radially arranged in a square which defines four corner grooves. The four corner grooves each include a side branch groove extending therefrom. In yet another embodiment, the radially extending grooves are arranged in a square which defines four sides of grooves. The end grooves of adjacent sides are joined to define four common vertices. The four common vertices each includes a side branch groove extending therefrom.

Accordingly, as described above, the radially extending grooves may extend parallel to one another as in a square embodiment, or may be nonparallel, as in a circular embodiment. The at least one of the radially extending grooves including a side branch groove extending therefrom may form a V-shaped radially extending groove.

It will be understood by those having skill in the art that the ring-shaped gate preferably comprises a gate insulating layer on the radially extending grooves including on the at least one side branch groove. A ring-shaped gate electrode is located on the gate insulating layer, opposite the radially extending grooves and the at least one side branch groove. The first doped region is preferably a source region and the second doped region is preferably a drain region. The grooves themselves may be U-shaped, V-shaped or arcuate in cross-section. A bias region may be included within the first doped region and a lightly doped region may be included, surrounding the second doped region. The field effect transistor may be formed in an epitaxial layer or in a well region.

Method aspects of the present invention form field effect transistors by forming a plurality of radially extending grooves in a microelectronic substrate, at least one of the radially extending grooves including a side branch groove which extends therefrom. A ring-shaped gate is formed on the radially extending grooves. Spaced apart source and drain regions are formed in the microelectronic substrate.

The ring-shaped gate defines inner and outer regions of the microelectronic substrate, and the step of forming spaced apart source and drain regions preferably comprises the steps of forming a source region in the inner region of the microelectronic substrate and a drain region in the outer region of the microelectronic substrate. The gate electrode is preferably formed by forming a gate insulating layer on the radially extending grooves including on the at least one side branch groove and forming a ring-shaped gate electrode on the gate insulating layer, opposite the radially extending grooves and the at least one side branch groove. Accordingly, the area of the gate electrode may be widened in the region where the channel width is relatively small, to thereby allow a decrease in the on-state resistance and an increase in the driver current of the field effect transistor.

BRIEF DESCRIPTION OF THE DRAWINGS

FIGS. 6, 7, 8 and 9 are cross-sectional views taken along line A–A' of FIG. 3 and FIGS. 10A and 10B are cross-sectional views taken along lines B–B' and C–C' of FIG. 3, respectively.

DETAILED DESCRIPTION OF PREFERRED EMBODIMENTS

Figure 1:
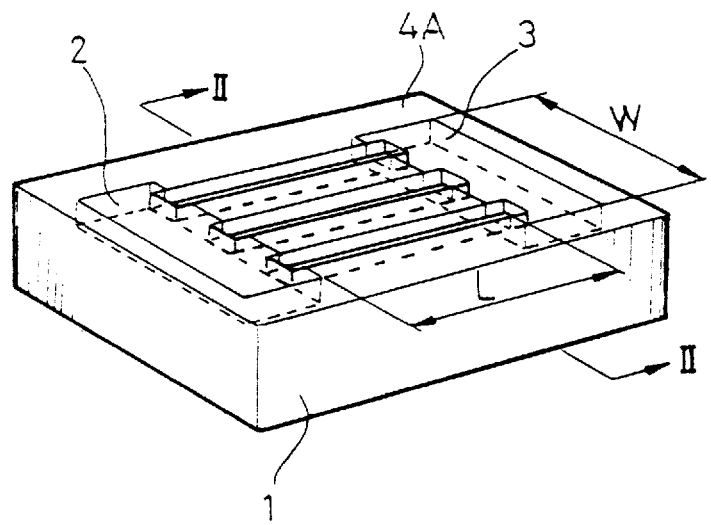
FIG. 1 is a perspective view of a conventional field effect transistor.
Figure 2:
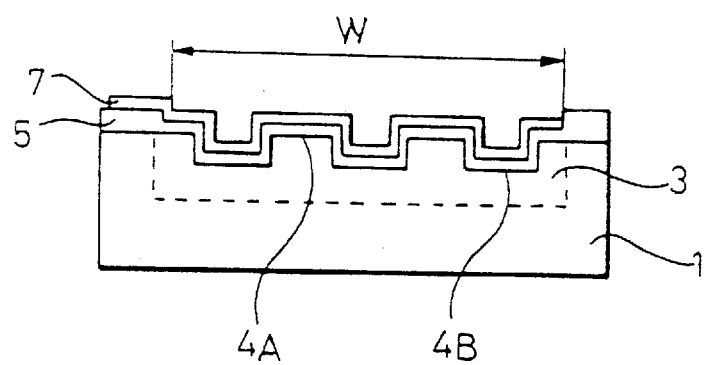
FIG. 2 is a cross-sectional view of the field effect transistor of FIG. 1 taken along lines II–II'.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, each embodiment described and illustrated herein includes its complementary embodiment as well.

Figure 3:
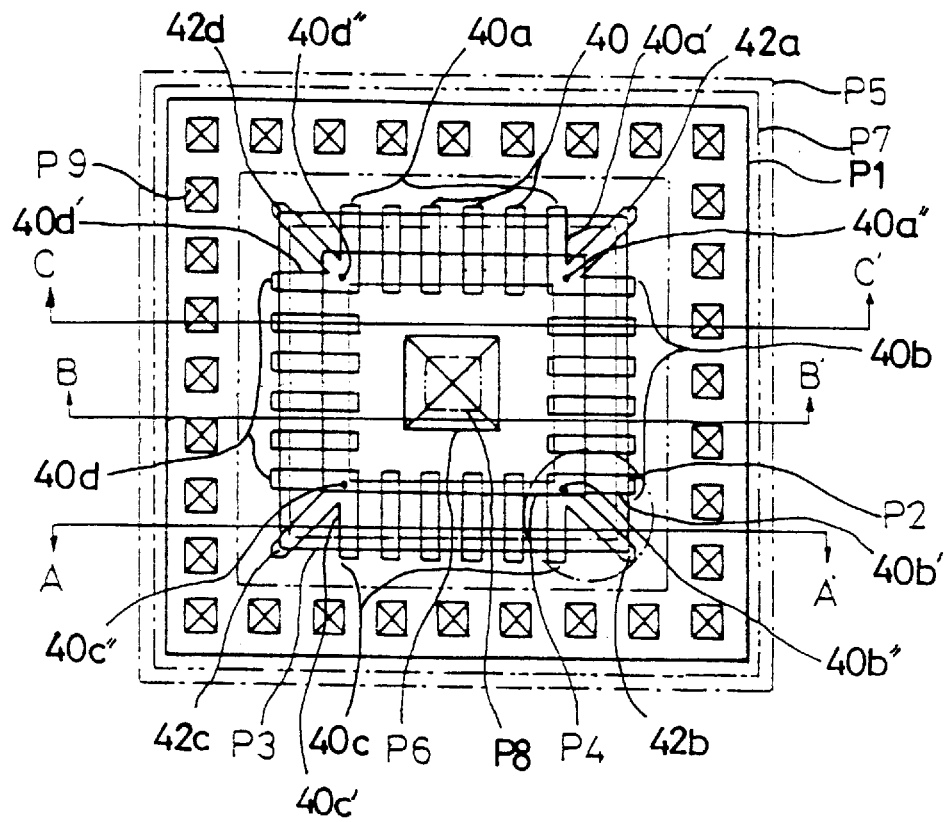
FIG. 3 is a plan view of a field effect transistor according to an embodiment of the present invention.

Referring now to FIG. 3, a plan view of a field effect transistor according to an embodiment of the present invention is shown. Nine mask patterns for forming the field effect transistor are shown in FIG. 3. Reference numeral P1 denotes a mask pattern for forming a field oxide layer which divides a microelectronic substrate into an active region and an inactive region. P2 denotes a mask pattern for forming radially extending grooves including at least one side branch groove according to the present invention. P3 denotes a mask pattern for patterning a gate electrode. P4 denotes a mask pattern for patterning a body region. P5 denotes a mask pattern for patterning an LDD region. P6 denotes a mask pattern for defining a high density source region. P7 denotes a mask pattern for limiting a high density drain region. P8 denotes a mask pattern for limiting a bias region. P9 denotes a mask pattern for forming contact holes.

Figure 4A:
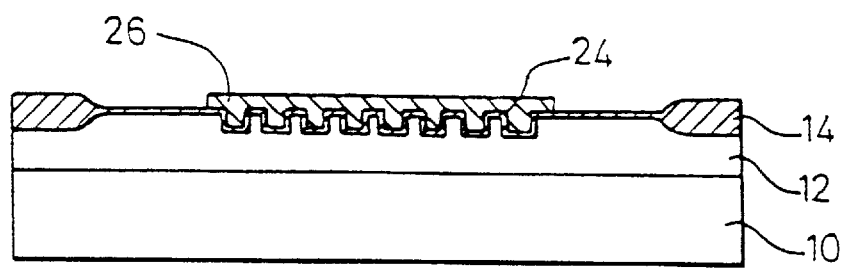
FIGS. 4A–4C are cross-sectional views taken along lines A–A', B–B' and C–C' of FIG. 3, respectively.
Figure 4B:
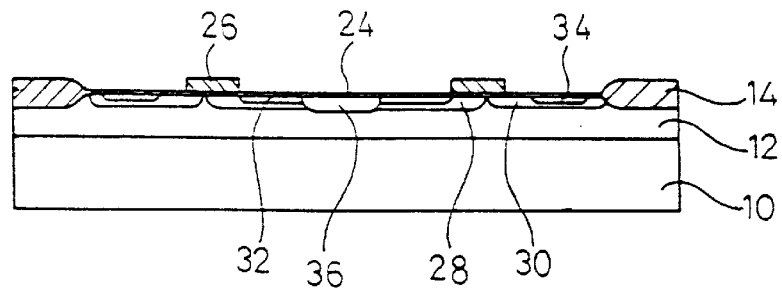
Figure 4C:
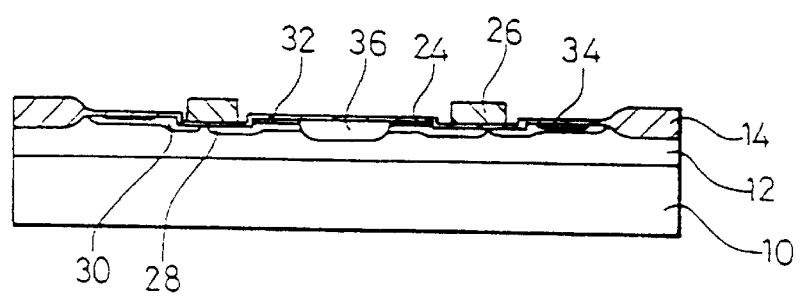

Referring now to FIGS. 4A–4C, a microelectronic substrate, such as a semiconductor substrate 10 of second conductivity type, includes an epitaxial layer 12 or a well of second conductivity type. A field oxide layer 14 is included in the epitaxial layer 12. A gate insulating layer 24 and a gate electrode 26 is also included. A body region 28, LDD region 30, source region 32, drain region 34 and bias region 36 are included.

Referring again to FIG. 3, a plurality of radially extending grooves 40 is included in the microelectronic substrate 10. As shown in FIG. 3, the radially extending grooves 40 may be formed as a square with four sides of grooves 40a, 40b, 40c and 40d. As shown in FIG. 3, the grooves on each side extend radially and are parallel. The grooves, however, need not be parallel.

As also shown in FIG. 3, four side branch grooves 42a, 42b, 42c and 42d are included. Each side branch groove extends from at least one of the radially extending grooves 40. More specifically, as shown in the embodiment of FIG. 3, each side of grooves 40a, 40b, 40c and 40d defines four corner grooves 40a', 40b', 40c' and 40d'. The four corner grooves each include a side branch groove 42a, 42b, 42c and 42d, respectively, extending therefrom.

The embodiment of FIG. 3 also illustrates the end grooves of adjacent sides 40a, 40b, 40c and 40d being joined to define four common vertices 40a", 40b", 40c" and 40d". The four common vertices each include a side branch 42a, 42b, 42c and 42d, respectively, extending therefrom. Thus, the radially extending grooves including the side branch grooves extending therefrom form V-shaped radially extending grooves.

Still referring to FIGS. 3 and 4A–4C, the grooves may be formed on the epitaxial layer 12 of semiconductor substrate 10. Then, a ring-shaped (also referred to as doughnut-shaped) gate electrode 26 is formed on the radially extending grooves. The ring-shaped gate defines inner and outer regions of the microelectronic substrate. The highly doped source region 32 is located in the inner region of the microelectronic substrate. The highly doped source region 32 may be surrounded by a body region 28. A highly doped drain region 34 is formed in the outer region and is surrounded by a lightly doped drain region 30. A bias region 36 may also be included in the high density $P^+$-type body region 28.

Accordingly, as illustrated, the grooves are radially arranged on the semiconductor substrate and include at least one side branch groove extending therefrom. Thus, the outside area of the gate electrode formed on the grooves may be greater than the inside area thereof. Since the side branch grooves cause the cross-sectional area of the transistor to be increased, the overall resistance may be decreased. In other words, the overall resistance may be decreased going from the source side to the drain side. This may provide a decrease in the on-state resistance and an increase in driver current.

Figure 5:
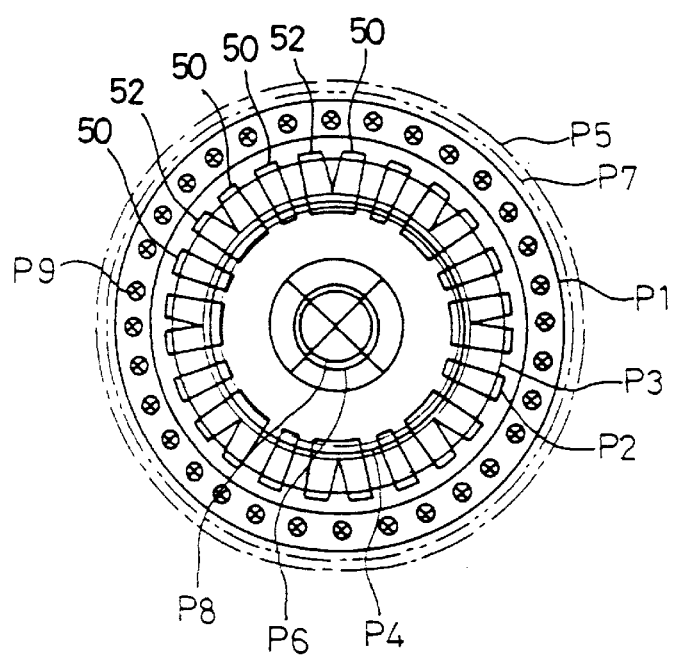
FIG. 5 is a plan view of a second embodiment of a field effect transistor according to the invention.

FIG. 5 is a plan view illustrating a second embodiment of field effect transistors according to the present invention. In the embodiment of FIG. 5, the radially extending grooves 50 are radially arranged in a circle. Alternating ones of the radially extending grooves 50 include a side branch groove 52 extending therefrom. Accordingly, the radially extending groove which includes a side branch groove, forms a V-shaped radially extending groove. It will be understood by those having skill in the art that a side branch groove may be provided for every second groove, every third groove, etc. and need not be provided in a symmetrical or periodic manner. Accordingly, the cross-sectional area of the gate electrode at the drain may be increased and the on-state resistance may be decreased while the driver current may be increased.

Figure 8:
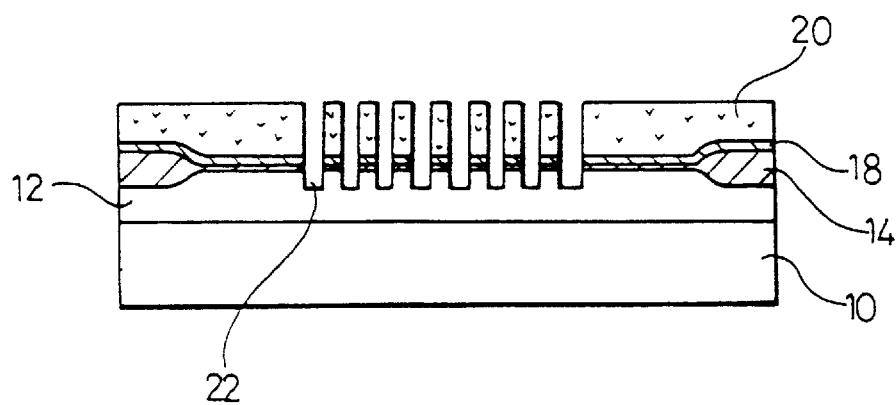
Figure 9:
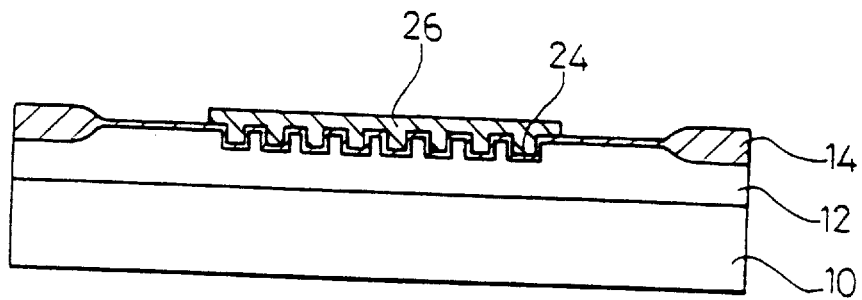
Figure 10A:
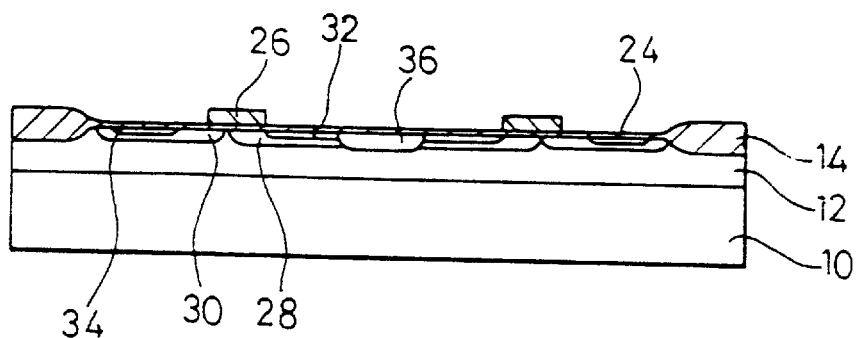
Figure 10B:
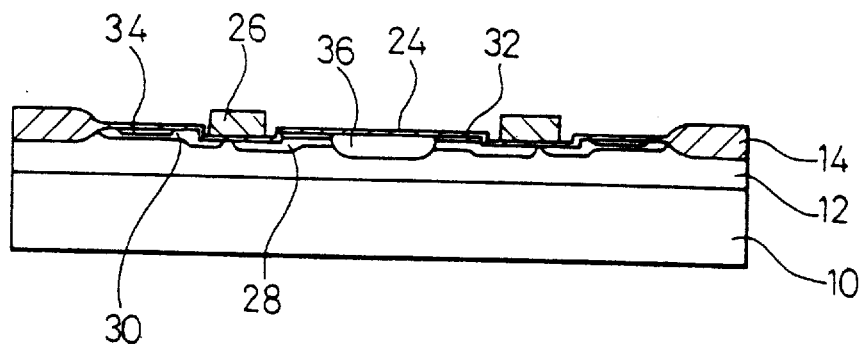

FIGS. 6 to 9, 10A and 10B are cross-sectional views of field effect transistors of the present invention, during intermediate fabrication steps. In detail, FIGS. 6 to 9 are cross-sectional views taken along the line A–A' of FIG. 3, and FIGS. 10A and 10B are cross-sectional views taken along the lines B–B' and C'–C' of FIG. 3, respectively.

Figure 6:
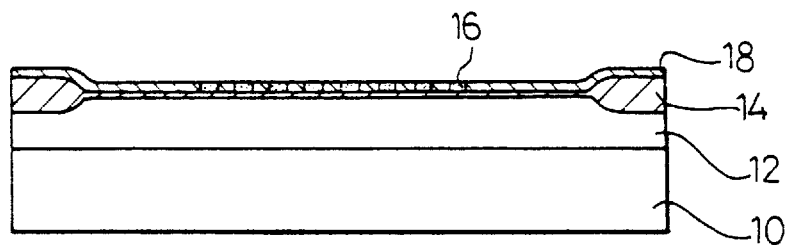
FIGS. 6, 7, 8, 9, 10A and 10B are cross-sectional views illustrating field effect transistors according to the present invention during intermediate fabrication steps, where

Referring to FIG. 6, an epitaxial layer 12 of the second conductivity type is grown on a semiconductor substrate 10 of the first conductivity type to a predetermined thickness. A well region may also be used. A field oxide layer 14 for dividing the substrate 10 into an active region and an inactive region is formed on the epitaxial layer 14 by a conventional isolation technique such as a local oxidation of silicon (LOCOS) process.

Thereafter, a pad oxide layer 16 is formed to a thickness of about 240 Å, and a nitride layer 18 is formed to a thickness of about 1000 Å. The pad oxide layer 16 may serve as a buffering layer during the etching process for forming the grooves in the epitaxial layer 12. The nitride layer 18 may serve as an etch mask for protecting the epitaxial layer where no grooves are formed.

Figure 7:
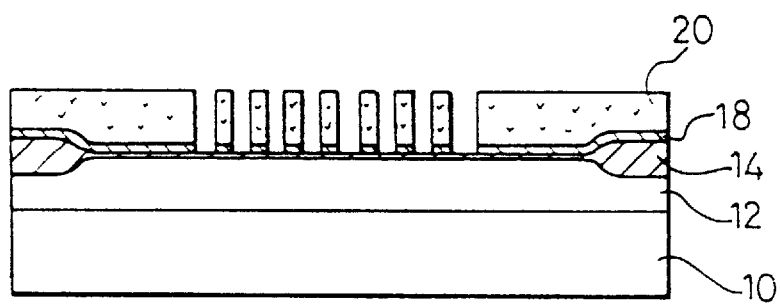

Referring to FIG. 7, a photoresist pattern 20 is formed on the nitride layer 18 in a photolithographic process using the mask pattern P2 of FIG. 3. The nitride layer is then etched using the photoresist pattern as a mask. The photoresist pattern 20 is radially formed in a square as shown as the mask pattern P2 in FIG. 3, and the corner portions thereof include the side branches extending therefrom as shown in FIG. 3.

Referring to FIG. 8, the grooves (also referred to as trenches) 22 having a predetermined depth are formed in the epitaxial layer 12 by etching the pad oxide layer and the epitaxial layer using the photoresist pattern and the patterned nitride layer as mask. The grooves 22 are radially arranged in a square and the corner portions thereof include the side branches. The number and the width of the grooves can be adjusted based on the desired device characteristics. Also, it is preferable that the number and the width of the side branches are adjusted based on the desired device characteristics.

Referring to FIG. 9, after the photoresist pattern, nitride layer, and pad oxide layer are removed, the gate insulating layer 24 is formed by growing a thermal oxide layer to a thickness of about 400 Å. A conductive material for the gate electrode, for example, polysilicon doped with an impurity, of a thickness of about 3000 Å, is deposited on the gate insulating layer. Then the deposited material is patterned to form the gate electrode 26.

The polysilicon layer doped with the impurity may be formed by a conventional method. For example, in situ doped polysilicon may be deposited. Alternatively, after intrinsic polysilicon is deposited, it is doped with $POCL_3$, or is highly doped with As by ion implantation. The gate electrode 26 having the shape of a hollow ring is formed on the surfaces of the grooves.

FIGS. 10A and 10B are cross-sectional views taken along the lines B–B' and C–C' of FIG. 3. Referring to FIGS. 10A and 10B, the body region 28, LDD region 30, high density $N^+$ type source region 32, drain region 34, and high density $P^+$ type bias region 36 are formed by conventional photolithographic process and the ion implantation process using the mask patterns P4 to P8 as shown in FIG. 3. The highly doped source region 32 is formed inside the gate electrode 26, and the highly doped drain region 34 is formed outside the gate electrode 26. The body region 28 is formed to surround the source region, and the LDD region 30 is formed to surround the drain region. Inside the source region, a high density $P^+$ type bias region 36 is formed. The field effect transistor may be completed using conventional protective layer forming process, metal wiring process, etc., which need not be described in detail herein.

The present invention is not limited to the embodiments as described above, and various modifications may be made by those skilled in the art. For example, the present invention may be applied to all kinds of field effect transistors besides DMOS transistors, to allow reduction of the on-state resistance and an increase in the driver current. Also, although the embodiments in which the gate electrode has the shape of a square or a ring have been described, the present invention can be applied to other field effect transistors in which the channel width of the source side is different from that of the drain side. Further, although the illustrated embodiments include grooves of a rectangular cross-section, it is also possible for the grooves to have the shape of "U", "V", arcuate shape or other shape using the LOCOS process.

As described above, according to the present invention, the ring-shaped gate electrode is formed on the surface of the substrate on which the grooves are formed, and the source and the drain are formed inside and outside the gate electrode, respectively. If the width of the source end of the channel is different form that of the drain end of the channel, selected grooves are formed to have side branches. Accordingly, the area of the gate electrode on a region where the channel width is relatively small may be widened, so that the on-state resistance may be decreased and the drive current may be increased.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A field effect transistor comprising:
   a microelectronic substrate;
   a plurality of radially extending grooves in the microelectronic substrate, at least one of the radially extending grooves including a side branch groove extending therefrom;
   a ring-shaped gate on the radially extending grooves, including on the at least one side branch groove the ring shaped gate defining inner and outer regions of the microelectronic substrate;

a first doped region in the inner region of the microelectronic substrate; and a second doped region in the outer region of the microelectronic substrate.

2. A field effect transistor according to claim 1 wherein the radially extending grooves are radially arranged in a circle, and wherein alternating ones of the radially extending grooves includes a side branch groove extending therefrom.

3. A field effect transistor according to claim 1 wherein the radially extending grooves are radially arranged in a square which defines four corner grooves, and wherein the four corner grooves each includes a side branch groove extending therefrom.

4. A field effect transistor according to claim 1 wherein the radially extending grooves are radially arranged in a square which defines four sides of grooves, wherein the end grooves of adjacent sides are joined to define four common vertices, and wherein the four common vertices each includes a side branch groove extending therefrom.

5. A field effect transistor according to claim 1 wherein at least some of the radially extending grooves extend parallel to one another.

6. A field effect transistor according to claim 1 wherein the at least one of the radially extending grooves including a side branch groove extending therefrom, forms a V-shaped radially extending groove.

7. A field effect transistor according to claim 1 wherein the a ring-shaped gate comprises:

a gate insulating layer on the radially extending grooves including on the at least one side branch groove; and a ring shaped gate electrode on the gate insulating layer, opposite the radially extending grooves and the at least one side branch groove.

8. A field effect transistor according to claim 1 wherein the first doped region is a source region and wherein the second doped region is a drain region.

9. A field effect transistor according to claim 1 wherein the radially extending grooves and the at least one side branch groove are U-shaped, V-shaped or arcuate in cross section.

10. A field effect transistor according to claim 1, further comprising:

a bias region in the microelectronic substrate, within the first doped region; and a lightly doped region surrounding the second doped region.

11. A field effect transistor according to claim 1 wherein the microelectronic substrate includes an epitaxial layer and wherein the grooves, first doped region and second doped region are in the epitaxial layer.

12. A field effect transistor according to claim 1 wherein the microelectronic substrate includes a well region and wherein the grooves, first doped region and second doped region are in the well region.

13. A field effect transistor comprising:

a microelectronic substrate;

spaced apart source and drain regions in the microelectronic substrate;

a plurality of grooves in the microelectronic substrate, extending from the source region to the drain region, at least one of the grooves including a side branch groove extending therefrom; and a gate on the plurality of grooves including on the side branch groove.

14. A field effect transistor according to claim 13 wherein one of the spaced apart source and drain regions is wider than the other of the spaced apart source and drain regions, and wherein the at least one side branch groove extends from the associated groove adjacent the other of the spaced apart source and drain regions and extends away from the associated groove towards the one of the spaced apart source and drain regions.

15. A field effect transistor according to claim 13 wherein the at least one of the grooves including a side branch groove extending therefrom, forms a V-shaped groove.

* * * * *